US 6,670,107 B2

(12) United States Patent
Lachowski

(10) Patent No.: US 6,670,107 B2
(45) Date of Patent: Dec. 30, 2003

(54) METHOD OF REDUCING DEFECTS

(75) Inventor: Joseph F. Lachowski, Sutton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 277 days.

(21) Appl. No.: 09/794,643

(22) Filed: Feb. 26, 2001

(65) Prior Publication Data

US 2002/0001780 A1 Jan. 3, 2002

Related U.S. Application Data

(60) Provisional application No. 60/185,343, filed on Feb. 26, 2000.

(51) Int. Cl.$^7$ .................................................. G03C 5/00
(52) U.S. Cl. ........................ 430/331; 430/311; 430/329; 510/175
(58) Field of Search .......................... 430/311, 329, 430/331; 510/175

(56) References Cited

U.S. PATENT DOCUMENTS

| | | | |
|---|---|---|---|
| 4,613,561 A | 9/1986 | Lewis | |
| 4,824,769 A | 4/1989 | Lewis et al. | |
| 5,164,286 A | 11/1992 | Blakeney et al. | |
| 5,279,771 A * | 1/1994 | Lee | 252/548 |
| 5,543,268 A | 8/1996 | Tanaka et al. | |
| 5,731,132 A | 3/1998 | van Werden et al. | |
| 5,741,621 A * | 4/1998 | Kempf et al. | 430/253 |
| 5,741,628 A | 4/1998 | Matsuo et al. | |
| 5,944,996 A * | 8/1999 | DeSimone et al. | 210/634 |
| 5,977,041 A | 11/1999 | Honda | |
| 6,017,766 A * | 1/2000 | Holt et al. | 436/164 |
| 6,127,101 A * | 10/2000 | Lassila et al. | 430/331 |
| 6,136,514 A | 10/2000 | Phan et al. | |
| 6,235,820 B1 * | 5/2001 | Lassila et al. | 524/100 |
| 6,247,856 B1 * | 6/2001 | Shibano et al. | 396/565 |
| 6,274,296 B1 | 8/2001 | Chu | |
| 6,379,875 B2 | 4/2002 | Chu | |

FOREIGN PATENT DOCUMENTS

| | | |
|---|---|---|
| JP | 1998256210 | 9/1998 |
| WO | WO 99 15345 | 4/1999 |
| WO | WO 99 53381 | 10/1999 |
| WO | WO 99 60448 | 11/1999 |

* cited by examiner

Primary Examiner—Tom Dunn
Assistant Examiner—Amanda C. Walke
(74) Attorney, Agent, or Firm—S. Matthew Cairns

(57) ABSTRACT

Disclosed are methods for the reduction of defects during the manufacture of electronic devices. Also disclosed are electronic devices having reduced numbers of defects.

20 Claims, No Drawings

METHOD OF REDUCING DEFECTS

This application claims benefit of provisional application 60/185,343 filed Feb. 26, 2000.

BACKGROUND OF THE INVENTION

The present invention relates generally to the field of manufacture of electronic devices. In particular, the present invention relates to compositions and methods for the reduction of defects during the manufacture of electronic devices.

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble. In general, photoresist compositions include at least a resin binder component and a photoactive agent.

Following exposure, the film layer of the photoresist composition is preferably baked at temperatures ranging from about 70° C. to 160° C. Thereafter, the film is developed. The exposed resist film is rendered positive working by employing a polar developer, typically an aqueous based developer, such as quaternary ammonium hydroxide solutions, such as tetra-alkyl ammonium hydroxide, preferably a 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like.

After development of the photoresist coating, the developed substrate may be selectively processed on those areas bared of resist, for example, by chemically etching or plating substrate areas bared of resist in accordance with procedures known in the art. For the manufacture of microelectronic substrates, e.g. the manufacture of silicon dioxide wafers, suitable etchants are a gas etchant, such as a chlorine- or fluorine-based etchant, such as $Cl_2$ or $CF_4/CHF_3$ etchant applied as a plasma stream. After such processing, the resist may be removed from the processed substrate using any stripping procedures known in the art.

Following contact of the photoresist with developer or stripper, the electronic device, e.g. a wafer, is then rinsed, typically first with iso-propanol and then with deionized water. Such rinses are used to remove any remaining developer or stripper solution and to help remove any remaining photoresist particles or residue. Even after such development, stripping and rinsing, the electronic device may contain on its surface residual photoresist, either in the form of polymer, particulates or residue. Such residual photoresist can cause defects, such as shorts, in the resulting electronic device.

There is thus a need for an effective method for reducing the number of defects in electronic devices, particularly those due to residual photoresist or photoresist residue remaining after development or stripping of the photoresist.

SUMMARY OF THE INVENTION

It has been surprisingly found that the number of defects in electronic devices can be significantly reduced according to the present invention. Yield losses due to defects are also improved by the compositions and methods of the present invention.

In one aspect, the present invention provides a method for reducing the number of defects in an electronic device including the step of contacting the electronic device with a composition including one or more surfactants and water, wherein the amount of surfactant in the composition is less than the critical micelle concentration.

In a second aspect, the present invention provides a method of manufacturing an electronic device including the steps of at least partially removing a photoresist layer from a substrate; and contacting the substrate having the partially removed photoresist with a composition including one or more surfactants and water, wherein the amount of surfactant in the composition is less than the critical micelle concentration.

In a third aspect, the present invention provides an electronic device prepared according to the method described above.

In a fourth aspect, the present invention provides a method of removing photoresist including the steps of contacting a photoresist layer on a substrate with a composition including one or more surfactants and water wherein the amount of surfactant in the composition is less than the critical micelle concentration; and at least partially removing the photoresist layer.

DETAILED DESCRIPTION OF THE INVENTION

As used throughout this specification, the following abbreviations shall have the following meanings unless the context clearly indicates otherwise: DI=deionized; ppm=parts per million; % wt=percent by weight; and RPM=revolutions per minute. All percents are by weight and all numerical ranges are inclusive.

The compositions of the present invention are suitable for reducing defects in an electronic device by removing polymeric residue from the surface of such device. In particular, the compositions of the present invention are particularly suitable for reducing defects in an electronic device by removing photoresist residue from the surface of such device. While not intending to be bound by theory, it is believed that the compositions of the present invention function to help solubilize, disperse, chelate, entrain, encapsulate or otherwise remove polymer residue, particularly polymer particulates, from the surface of the substrates so treated. The present invention may be used in the manufacture of any electronic devices, such as, but not limited to, wafers, circuit boards, and the like.

The compositions of the present invention include one or more surfactants and water, wherein the amount of the surfactant in the composition is less than the critical micelle concentration. While any grade of water is suitable for use in the present invention, deionized water is preferred.

The particular surfactant used in the present invention is not critical. Thus, any surfactant is suitable for use in the present invention. Thus, anionic, cationic, nonionic and amphoteric surfactants may be advantageously used in the present invention. It is preferred that the surfactant is cationic or nonionic, and more preferably nonionic. Particularly suitable nonionic surfactants are ethylene oxide/propylene oxide ("EO/PO") copolymers. It will be appreciated by those skilled in the art that mixtures of surfactants may be suitably used in the present invention. Thus, mixtures of cationic and nonionic surfactants and mixtures of anionic and nonionic surfactants may be used in the present invention. Such surfactants are generally commercially available from a variety of sources and may be used without further purification. Such surfactants may be available as an aqueous composition, which may be used in the present invention.

Any amount of surfactant is suitable for use in the present invention as long as it is less than the critical micelle concentration ("CMC"). "Critical micelle concentration" refers to the concentration of surfactant in water above which the surface tension remains substantially invariant with increasing surfactant concentration. Such critical micelle concentration is well known to those skilled in the art. Typically, the amount of surfactants used in the present invention is less than about 5000 ppm, preferably less than about 1000 ppm, more preferably less than 500 ppm and most preferably less than about 250 ppm.

The compositions of the present invention may optionally include one or more additional components, such as, but not limited to, corrosion inhibitors, cosolvents, chelating agents and the like. It is preferred that the compositions of the present invention are free of corrosion inhibitors. It is also preferred that the compositions of the present invention are free of cosolvents.

Any corrosion inhibitor which reduces corrosion metal film layers, is water soluble and is compatible with the one or more surfactants is suitable for use in the present invention. Suitable corrosion inhibitors include, but are not limited to, catechol, $(C_1-C_6)$alkylcatechol such as methylcatechol, ethylcatechol and tert-butylcatechol, benzotriazole, $(C_1-C_{10})$alkylbenzotriazoles; $(C_1-C_{10})$ hydroxyalkylbenzotriazoles; 2-mercaptobenimidazole, gallic acid; gallic acid esters such as methyl gallate and propyl gallate; and the like. Such corrosion inhibitors are generally commercially available from a variety of sources, such as Aldrich (Milwaukee, Wis.) and may be used without further purification.

The corrosion inhibitors are typically present in the compositions of the present invention in an amount in the range of from about 0.01 to about 5% wt, based on the total weight of the composition. It is preferred that the amount of corrosion inhibitor is from about 0.1 to about 3% wt.

Any solvent which is water miscible and is compatible with the one or more surfactants is suitable for use in the present invention. Suitable cosolvents useful in the present invention include, but are not limited to, $(C_1-C_{20})$ alkanediols such as ethylene glycol, diethylene glycol, propylene glycol, 2-methylpropanediol and dipropylene glycol; $(C_1-C_{20})$alkanediol $(C_1-C_6)$alkyl ethers such as propylene glycol monomethyl ether, propylene glycol dimethyl ether, propylene glycol n-butyl ether, dipropylene glycol monomethyl ether, dipropylene glycol dimethyl ether, dipropyleneglycol monobutyl ether, tripropyleneglycol monomethyl ether and propylene glycol methyl ether acetate; aminoalcohols such as aminoethylaminoethanol; N-$(C_1-C_{10})$ alkylpyrrolidones such as N-methylpyrrolidone, N-ethylpyrrolidone, N-hydroxyethylpyrrolidone and N-cyclohexylpyrrolidone; $(C_1-C_{10})$alcohols such as ethanol and iso-propanol; and the like. It is preferred that the cosolvent is one or more of $(C_1-C_{20})$alkanediols, $(C_1-C_{20})$ alkanediol $(C_1-C_6)$alkyl ethers and $(C_1-C_{10})$alcohols and more preferably one or more of propylene glycol monomethyl ether, propylene glycol dimethyl ether, propylene glycol n-butyl ether, dipropylene glycol monomethyl ether, dipropylene glycol dimethyl ether, dipropyleneglycol n-butyl ether, tripropylene glycol monomethyl ether, propylene glycol methyl ether acetate ethanol and iso-propanol. Such cosolvents are generally commercially available from a variety of sources, such as Aldrich (Milwaukee, Wis.) and may be used without further purification.

When such cosolvents are used they are typically present in an amount in the range of about 0.5 to about 80% wt, based on the total weight of the composition, and preferably about 1 to about 45% wt.

The compositions of the present invention may be prepared by combining the one or more surfactants and water in any order. It is preferred that the one or more surfactants are added to water. When mixtures of surfactants are used, they may be first combined and then added to the water, and preferably added to the water separately.

The compositions of the present invention are suitable for a variety of applications in the manufacture of electronic devices, such as, but not limited to, as a pre-wetting agent prior to development or stripping of a photoresist, as a rinse after development or stripping of a photoresist, and as a final polish after rinsing.

When the compositions of the present invention are used as a pre-wetting agent, the photoresist layer is contacted with the treatment solution of the present invention prior to being at least partially removed. By "at least partially removing" the photoresist is meant that a portion of the photoresist layer is removed. Such at least partial removal includes development of the photoresist where only exposed or unexposed portions of the photoresist are removed as well as stripping where substantially all of the photoresist layer is removed.

In such pre-wetting process, the photoresist layer on the substrate is contacted with the compositions of the present invention for a period of time sufficient to wet the surface of the photoresist layer. Such "wetting" enhances the ability of developers or strippers to remove the desired portions of the photoresist layer. After wetting, the photoresist layer is optionally rinsed, such as with iso-propanol or water, before being contacted with either developer or stripper. Following development or stripping of the photoresist, the substrate is subjected to conventionally processing conditions such as, but not limited to, rinsing and drying.

The compositions of the present invention are effective in reducing the amount of polymeric residue, and in particular photoresist residue, after development or stripping of a photoresist layer on a substrate, such as an electronic device. Thus, the present invention is useful in reducing the number of defects in an electronic device including the steps of contacting the electronic device with a composition including one or more surfactants and water, wherein the amount of surfactant in the composition is less than the critical micelle concentration.

Typically, the photoresist layer on a substrate is at least partially removed by development or stripping. After such development or stripping, the substrate is optionally rinsed such as with water or iso-propanol, and then contacted with the compositions of the present invention. The substrate is contacted with a composition of the present invention for a period of time sufficient to remove any photoresist, either in the form of polymer, particulates or residue. Typically, the substrate is contacted with the compositions of the present invention for about 120 seconds or less, preferably for about 60 seconds or less, and more preferably for about 30 seconds or less. After such contact with the treatment solutions of the present invention, the substrate may be rinsed a second time such as with DI water or iso-propanol prior to drying. In an alternative embodiment, such second rinse may be eliminated and the substrate may be dried after contact with the treatment solution.

The compositions of the present invention may be used as a final polish. Thus, a substrate may be contacted with the composition, rinsed with DI water, and then contacted with a fresh bath of the composition prior to drying.

The substrates may be contacted with the compositions of the present invention by any known means, such as immersing the substrates in a bath containing the compositions or by dispensing such compositions on the substrate, such as by spraying. It is preferred that the compositions of the present invention are sprayed onto a substrate and more preferably onto a spinning substrate.

The substrate may be dried by any known means, such as spin drying or under an atmosphere stream, such as a nitrogen stream. It is preferred that the substrate is spin dried. When the substrate is spin dried, it may be dried at any speed, such as from 100 to 5000 RPM. It is preferred that the substrate is spin dried at a slower speed. Thus, it is preferred that the substrate is spin dried at a speed of from about 100 to about 1500 RPM.

The present invention is particularly useful in the manufacture of electronic devices, such as but not limited to, wafers, semiconductors, printed wiring boards and the like. Thus, the present invention provides a method of manufacturing electronic devices including the steps of at least partially removing a photoresist layer from a substrate; and contacting the substrate having the partially removed photoresist with a composition including one or more surfactants and water, wherein the amount of surfactant in the composition is less than the critical micelle concentration. Electronic devices produced by the methods of the present invention have significantly reduced numbers of defects as compared to electronic devices manufactured by conventional methods.

An advantage of the present invention is that the treatment solutions may be used as a replacement for iso-propanol rinses in the manufacture of electronic device, particularly iso-propanol rinses following development or stripping of photoresist layers.

The following examples are intended to illustrate further various aspects of the present invention, but are not intended to limit the scope of the invention in any aspect.

EXAMPLE 1

Two surfactant solutions were prepared. Sample A contained 25 ppm of a commercially available EO/PO copolymer nonionic surfactant in DI water. Sample B contained 50 ppm of the same surfactant as Sample A in DI water. A series of test wafers containing a photoresist layer that had been exposed were developed using standard methods. Following development, a portion of the wafers were rinsed using Sample A and a portion of the wafers were rinsed using Sample B. Following rinsing with Samples A or B, the wafers were dried by spin drying at two speeds. The slow spin dry speed was 500 RPM and the fast spin dry speed was 5000 RPM. After drying, defect maps of the test wafers were prepared using a Tencor defect scan and standard techniques. The sum of all defects are reported in Table 1 as an average of duplicate experiments. The control sample was a wafer coated with a photoresist layer that was not exposed, but was developed in the same manner as the test wafers and was then rinsed with DI water and spin dried at only 4000 RPM. The defect scan of the control sample stopped counting defects when approximately 75% of the wafer had been scanned as the number of defects surpassed a preset maximum.

TABLE 1

| Sample | Average Number of Defects | |
|---|---|---|
| | Slow Spin Dry | Fast Spin Dry |
| A | 1475 | 20270 |
| B | 2000 | 24350 |
| Control | >31000 | >31000 |

The above data clearly show that the treatment solutions of the present invention significantly reduce the number of defects, particularly at slow spin drying speeds.

EXAMPLE 2

The procedure of Example 1 was repeated except that after development, the test wafers were rinsed with DI water prior to rinsing with Samples A or B. The results are reported in Table 2.

TABLE 2

| Sample | Average Number of Defects | |
|---|---|---|
| | Slow Spin Dry | Fast Spin Dry |
| A | 240 | 30700 |
| B | 420 | 30700 |
| Control | >31000 | >31000 |

The above data clearly show that the treatment solutions of the present invention significantly reduce the number of defects, particularly at slow spin drying speeds.

What is claimed is:

1. A method for reducing the number of defects in an electronic device comprising the steps of: first at least partially removing a photoresist from an electronic device, and then contacting the electronic device with a composition consisting essentially of one or more surfactants, water an optionally one or more organic solvents, wherein the amount of surfactant in the composition is less than the critical micelle concentration.

2. The method of claim 1 wherein the surfactant is selected from cationic surfactants or nonionic surfactants.

3. The method of claim 1 wherein the amount of surfactant is less than about 5000 ppm.

4. The method of claim 3 wherein the amount of surfactant is less than about 1000 ppm.

5. The method of claim 1 wherein the electronic device is a semiconductor.

6. The method of claim 1 wherein the photoresist layer is removed by development.

7. The method of claim 1 wherein the photoresist layer is removed by stripping.

8. A method of manufacturing an electronic device comprising the steps of: first at least partially removing a photoresist layer from a substrate; and then contacting the substrate having the partially removed photoresist with a composition consisting essentially of one or more surfactants, water and optionally one or more organic solvents, wherein the amount of surfactant in the composition is less than the critical micelle concentration.

9. The method of claim 8 wherein the amount of surfactant is less than about 5000 ppm.

10. The method of claim 9 wherein the amount of surfactant is less than about 1000 ppm.

11. The method of claim 8 wherein the electronic device is a semiconductor.

12. An electronic device prepared according to claim 8.

13. The method of claim 8 wherein the photoresist layer is removed by development.

14. The method of claim 8 wherein the photoresist layer is removed by stripping.

15. A method of removing photoresist comprising the steps of: first contacting a photoresist layer on a subsate with a composition consisting essentially of one or more surfactants, water and optionally one or more organic solvents wherein the amount of surfactant in the composition is less than the critical micelle concentration; and then at least partially removing the photoresist layer.

16. The method of claim 15 wherein the photoresist layer is removed by development.

17. The method of claim 15 wherein the photoresist layer is removed by stripping.

18. The method of claim 1 wherein the one or more organic solvents are selected from the group consisting of $(C_1-C_{20})$alkanediols, $(C_1-C_{20})$alkanediol $(C_1-C_6)$alkyl ethers, N-$(C_1-C^{10})$alkylpyrrolidones and $(C_1-C_{10})$alcohols.

19. The method of claim 8 wherein the one or more organic solvents are selected from the group consisting of $(C_1-C_{20})$alkanediols, $(C_1-C_{20})$alkanediol $(C_1-C_6)$alkyl ethers, N-$(C_1-C_{10})$alkylpyrrolidones and $(C_1-C_{10})$alcohols.

20. A method of manufacturing an electronic device comprising the steps of: first developing a photoresist on a substrate; optionally rinsing the developed photoresist and then contacting the developed photoresist layer with a composition consisting essentially of one or more surfactants, water and optionally one or more organic solvents.

* * * * *